US010699978B2

(12) United States Patent
Otremba et al.

(10) Patent No.: US 10,699,978 B2
(45) Date of Patent: Jun. 30, 2020

(54) SMD PACKAGE WITH TOP SIDE COOLING (71) Applicant: Infineon Technologies Austria AG, Villach (AT)

(72) Inventors: Ralf Otremba, Kaufbeuren (DE); Amirul Afiq Hud, Melaka (MY); Teck Sim Lee, Melaka (MY); Xaver Schloegel, Sachsenkam (DE); Bernd Schmoelzer, Radenthein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/124,448

(22) Filed: Sep. 7, 2018

(65) Prior Publication Data
US 2019/0080973 A1 Mar. 14, 2019

(30) Foreign Application Priority Data

Sep. 8, 2017 (DE) .................. 10 2017 120 753

(51) Int. Cl.
*H01L 23/045* (2006.01)
*H01L 23/36* (2006.01)
(Continued)

(52) U.S. Cl.
CPC ............ *H01L 23/045* (2013.01); *H01L 23/36* (2013.01); *H01L 23/367* (2013.01);
(Continued)

(58) Field of Classification Search
CPC ... H01L 23/045; H01L 23/48; H01L 23/4334; H01L 23/36; H01L 23/367; H01L 23/3107; H01L 23/49541; H01L 23/49568
See application file for complete search history.

(56) References Cited

U.S. PATENT DOCUMENTS 5,272,375 A 12/1993 Belopolsky
5,581,118 A 12/1996 Mays
(Continued)

FOREIGN PATENT DOCUMENTS

DE 69525420 T2 10/2002
DE 102009000588 A1 10/2009
(Continued)

*Primary Examiner* — Yasser A Abdelaziez
(74) *Attorney, Agent, or Firm* — Murphy, Bilak & Homiller, PLLC (57) ABSTRACT A package encloses a power semiconductor die and has a package body with a package top side, package footprint side and package sidewalls. The die has first and second load terminals for blocking a blocking voltage. A lead frame structure electrically and mechanically couples the package to a support and includes an outside terminal extending out of the package footprint side and/or the sidewalls, and is electrically connected with the first load terminal. A top layer arranged at the package top side is electrically connected with the second load terminal. A creepage length between the electrical potential of the outside terminal and the electrical potential of the top layer is defined by a package body surface contour. The surface contour is formed at least by the package top side and package sidewall. At least one structural feature also forms the surface contour is configured to increase the creepage length.

18 Claims, 4 Drawing Sheets (51) Int. Cl.
 *H01L 23/433* (2006.01)
 *H01L 23/48* (2006.01)
 *H01L 23/367* (2006.01)
 H01L 23/31 (2006.01)
 H01L 23/495 (2006.01)

(52) U.S. Cl.
 CPC .......... *H01L 23/4334* (2013.01); *H01L 23/48* (2013.01); *H01L 23/3107* (2013.01); *H01L 23/49541* (2013.01)

(56) References Cited

U.S. PATENT DOCUMENTS

| | | | |
|---|---|---|---|
| 6,081,027 A | 6/2000 | Akram | |
| 6,181,007 B1 | 1/2001 | Yamazaki et al. | |
| 7,847,395 B2 * | 12/2010 | Baek | H01L 23/3107 257/712 |
| 2004/0169289 A1 | 9/2004 | Satou et al. | |
| 2004/0232545 A1 | 11/2004 | Takaishi | |
| 2010/0133670 A1 * | 6/2010 | Liu | H01L 23/49524 257/675 |
| 2010/0148346 A1 | 6/2010 | Quinones et al. | |
| 2012/0043662 A1 | 2/2012 | Ohno | |
| 2014/0035112 A1 | 2/2014 | Kadoguchi et al. | |
| 2016/0104697 A1 * | 4/2016 | Cho | H01L 23/04 257/195 |
| 2017/0092559 A1 | 3/2017 | Iwasaki et al. | |
| 2018/0005920 A1 * | 1/2018 | Kajihara | H01L 23/36 |

FOREIGN PATENT DOCUMENTS

| | | |
|---|---|---|
| DE | 102012112769 A1 | 6/2013 |
| DE | 102015101674 A1 | 8/2016 |
| DE | 102015120396 A1 | 6/2017 |

* cited by examiner

SMD PACKAGE WITH TOP SIDE COOLING

TECHNICAL FIELD

This specification refers to embodiments of a package enclosing a power semiconductor die. In particular, this specification refers to embodiments of a Surface-Mount Device (SMD) package with Top Side Cooling.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a power semiconductor die configured to conduct a load current along a load current path between two load terminals of the die. Further, the load current path may be controlled, e.g., by means of an insulated electrode, sometimes referred to as gate electrode. For example, upon receiving a corresponding control signal from, e.g., a driver, the control electrode may set the power semiconductor device in one of a conducting state and a blocking state.

After the power semiconductor die has been manufactured, it is usually installed within in a package, e.g., in a manner that allows the package with the die to be arranged within an application, e.g., in a power converter, e.g., such that the die may be coupled to a support, e.g., a printed circuit board (PCB).

To this end, a technology commonly referred to as surface-mount technology (SMT) is known, wherein this notion may generally refer to producing electronic circuits in which the components are mounted or placed directly onto the surface of a PCB. Such a component is hence referred to as surface-mount-device (SMD) component. For example, this technology has replaced, at least in some application areas, the co-called through-hole technology construction method of fitting components with wire leads into holes in the circuit board.

Generally, an SMD component can be smaller than its through-hole counterpart. It may have short pins or leads of various styles, flat contacts (also known as "terminal pads"), a matrix of solder balls (e.g., a so-called Ball Grid Array (BGA)), and/or terminations on the package body of the component.

Exemplary configurations of an SMD package are known from documents DE 10 2015 101 674 A1 and DE 10 2015 120 396 A1. Each of these SMT packages encloses a power semiconductor die and has a package body with a package top side, a package footprint side and package sidewalls, wherein the package sidewalls extend from the package footprint side to the package top side. The die has a first load terminal and a second load terminal and is configured to block a blocking voltage applied between the load terminals. The packages each further comprise a lead frame structure configured to electrically and mechanically couple the package to a support with the package footprint side facing to the support. The lead frame structure comprises outside terminals extending out of the package sidewall and electrically connected with the first load terminal of the die. Further, each of the packages comprise a top layer arranged at the package top side and being electrically connected with the second load terminal of the die.

Accordingly, each of these SMD packages known from documents DE 10 2015 101 674 A1 and DE 10 2015 120 396 A1 may exhibit a package top side that faces away from the support and that is equipped with a top layer to which a heat dissipation device, e.g., a heat sink, may be mounted. Thereby, heat can be removed away from the package that encloses the die. Such kind of packages may hence be referred to as a SMD-Top Side Cooling (SMD-TSC) packages.

The primary function of the heat dissipation device is to remove heat away from the package body; however, it has to simultaneously be ensured that the arrangement of the heat dissipation device and the package body fulfills safety requirements regarding, e.g., a minimum clearance distance and a minimum creepage length.

SUMMARY

Certain aspects of the present specification are related to the surface-mount packaging technology. Exemplary embodiments of the package disclosed herein are surface-mount device (SMD) packages.

According to an embodiment, a package encloses a power semiconductor die and has a package body with a package top side, a package footprint side and package sidewalls, the package sidewalls extending from the package footprint side to the package top side, wherein the die has a first load terminal and a second load terminal and is configured to block a blocking voltage applied between the load terminals. The package comprises a lead frame structure configured to electrically and mechanically couple the package to a support with the package footprint side facing to the support, the lead frame structure comprising at least one first outside terminal extending out of the package footprint side and/or out of one of the sidewalls and electrically connected with the first load terminal of the die; a top layer arranged at the package top side and being electrically connected with the second load terminal of the die, wherein a creepage length between the electrical potential of the at least one first outside terminal and the electrical potential of the top layer is defined by a package body surface contour, the surface contour being formed at least by the package top side and the package sidewall; and at least one structural feature that also forms the surface contour and that is configured to increase the creepage length.

According to a further embodiment, a package encloses a power semiconductor die and has a package body with a package top side, a package footprint side and package sidewalls, the package sidewalls extending from the package footprint side to the package top side, wherein the die has a first load terminal and a second load terminal and is configured to block a blocking voltage applied between the load terminals, wherein the package comprises: a lead frame structure configured to electrically and mechanically couple the package to a support with the package footprint side facing to the support, the lead frame structure comprising at least one first outside terminal extending out of the package footprint side and/or out of one of the sidewalls and electrically connected with the first load terminal of the die; and a top layer arranged at the package top side and being electrically connected with each of the second load terminal of the die. The package top side is separated into at least a first section at a first vertical level and at least a second section at or lower than a second vertical level that is lower than the first vertical level. The top layer is arranged at the first section at the first vertical level. The second section extends to the package sidewall and forms an edge therewith.

According to a yet further embodiment, a package encloses a power semiconductor die and has a package body with a package top side, a package footprint side and package sidewalls, the package sidewalls extending from the package footprint side to the package top side, wherein the die has a first load terminal and a second load terminal and is configured to block a blocking voltage applied between the load terminals, wherein the package comprises: a lead frame structure configured to electrically and mechanically couple the package to a support with the package footprint side facing to the support, the lead frame structure comprising at least one first outside terminal extending out of the package footprint side and/or out of one of the sidewalls and electrically connected with the first load terminal of the die; a top layer arranged at the package top side and being electrically connected with the second load terminal of the die; and a heat dissipation device arranged external of the package body and in electrical contact with the top layer, wherein the heat dissipation device exhibits a bottom surface greater than the surface of the top layer, and wherein in a region where the heat dissipation device passes over the top layer, the package top side is separated into at least a first section at a first vertical level and at least a second section at or lower than a second vertical level that is lower than the first vertical level, wherein the top layer is arranged at the first section at the first vertical level.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals may designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor die, e.g., a power semiconductor die that may be used within a power converter or a power supply. Thus, in an embodiment, such die can be configured to carry a load current that is to be fed to a load and/or, respectively, that is provided by a power source. For example, the die may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the die.

The term "power semiconductor die" as used in this specification intends to describe a single die with high voltage blocking and/or high current-carrying capabilities. In other words, such power semiconductor die is intended for high current, typically in the Ampere range, e.g., up to 5 or 100 Amperes, and/or voltages typically above 15 V, more typically up to 40 V, and above, e.g., up to at least 500 V or more than 500 V, e.g. at least 600 V.

For example, the power semiconductor die described below may be a die that is configured to be employed as a power component in a low-, medium- and/or high voltage application. For example, the term "power semiconductor die" as used in this specification is not directed to logic semiconductor devices that are used for, e.g., storing data, computing data and/or other types of semiconductor based data processing.

Before being able to be employed within an application, the power semiconductor die is usually included within a package that may allow mechanically mounting and electrically connecting the die within the application, e.g., also for heat distribution purposes. As has been introductorily mentioned, this may include applying the surface-mount technology (SMT).

Exemplary embodiments of the package disclosed herein are surface-mount-device (SMD) packages. For example, embodiments of the package disclosed herein are SMD packages with flat contacts that interface with a support, e.g., a PCB.

Figure 1:
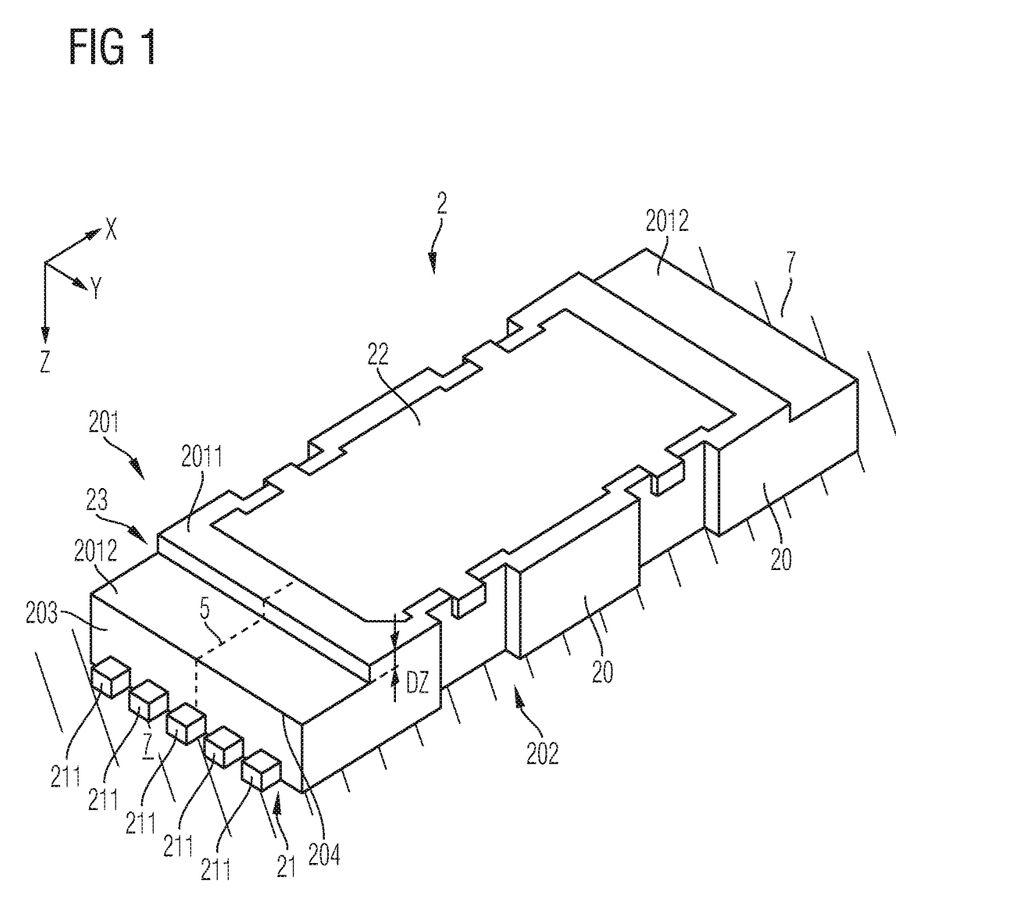
FIG. 1 schematically and exemplarily illustrates a section of a perspective view of a package in accordance with one or more embodiments.

FIG. 1 schematically and exemplarily illustrates a section of a perspective view of a package 2 in accordance with one or more embodiments, and FIGS. 2-4C each schematically and exemplarily illustrate a section of a vertical cross-section of a package 2 in accordance with one or more embodiments. In the following, it will be referred to each of FIGS. 1-4C.

The package 2 encloses a power semiconductor die (not illustrated), in the following also referred to as die. For example, the die has one of a power semiconductor transistor configuration or a power semiconductor diode configuration, e.g., a MOSFET configuration, an IGBT configuration, or a configuration derived from these basic configurations.

The power semiconductor die may hence comprise a first load terminal (not illustrated) and a second load terminal (not illustrated) and may be configured to conduct a load current between these load terminals. The load current maybe within the range of 1 A to 700 A, for example within the range of 10 A to 50 A. The maximum load current that can continuously be conducted by the die can be indicated by a load current rating of the die. Further, the enclosed die may be configured to block a blocking voltage applied between the first load terminal and the second load, e.g., within the range of 10 V to 1000 V, e.g., within the range of 50 V to 600 V. The maximum voltage that can continuously be blocked by the die can be indicated by a blocking voltage rating of the die.

In an embodiment, the die can be one of a power diode, in which case the first load terminal can be anode port and the second load terminal can be cathode port, a power IGBT, in which case the first load terminal can be an emitter terminal and the second load terminal can be collector terminal, a MOSFET, in which case the first load terminal can be a source terminal and the second load terminal can be drain terminal, or a power device derived from one or more of these basic configurations, e.g., a JFET (Junction Field Effect Transistor), sometimes referred to as SFET (German: Sperrschicht Feld Effekt Transistor).

For example, the die includes or, respectively, is a monolithic bidirectionally blocking and conducting power semiconductor switch, e.g., the die can be one of a Si—, SiC-MOSFET or a GaN-HEMT (high-electron-mobility transistor).

Further, the die that is enclosed by the package 2 can have a vertical configuration, according to which the first load terminal is arranged at a die frontside and the second load terminal is arranged at a die backside. In lateral directions, e.g., in the lateral directions X and Y and linear combinations thereof, the die may be terminated by a die edge, e.g., a side surface.

The package 2 that encloses the die has a package body 20 with a package top side 201, a package footprint side 202 and package sidewalls 203, the package sidewalls 203 extending from the package footprint side 202 to the package top side 201. The package body 20 can be made of a molding mass.

For example, the package body 20 exhibits a flat configuration, according to which: each of the package top side 201 the package footprint side 202 extend substantially horizontally; the package sidewalls 203 extend substantially vertically; and a maximum horizontal extension of the package footprint side 202 amounts to at least twice of a maximum vertical extension of the package sidewalls 203.

For example, the die is sandwiched in between the package top side 201 and the package footprint side 202. The package body 20 may entirely surround the die and seal the die against the environment.

The package 2 enclosing the die may be mounted on a support 7, e.g., in accordance with the surface-mount technology. For example, the package 2 may be a surface-mount technology (SMT) package. Further, when being mounted on the support 7, the die included in the package 2 may be electrically connected with other components (not illustrated) that are provided (e.g. fixed) at the support 7.

The support 7 may be a printed circuit-board (PCB) or may be a component of a PCB. In another embodiment, the support 7 may be a Direct Copper Bond (DCB) substrate, e.g. a ceramic circuit board, or may be a component of a DCB substrate. In yet another embodiment, the support 7 may also be based on an Insulated Metallic Substrate (IMS). The support 7 may be made of an electrically insulating material, e.g., made of a polymer, a PCB laminate, a ceramic, a flame retardant (FR) material (e.g., FR4), a composite epoxy material (CEM), such as CEM1 or CEM3, a Bismaleimide-Triazine resin (BT) material, imide, polyimide, ABF, or made of a combination of the aforementioned exemplary materials.

The die may be arranged in the package 2 in such a manner that the die frontside faces to the package footprint side 202 and that the die backside faces to the package top side 201, or vice versa. Further, the package footprint side 202 may face to a surface 70 of the support 7. For example, the surface 70 is arranged horizontally, e.g., in parallel to the plane defined by the first lateral direction X and the second lateral direction Y.

Figure 2:
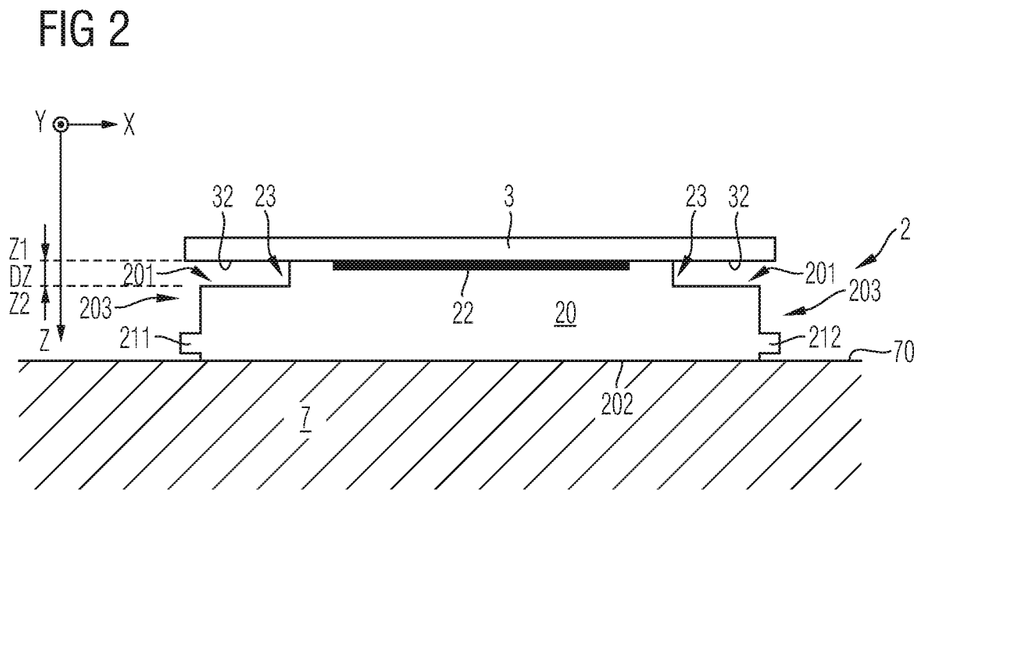
FIGS. 2, 3, 4A-4C each schematically and exemplarily illustrate a section of a vertical cross-section of a package in accordance with one or more embodiments.

For example, the package 2 may comprise a lead frame structure 21 configured to electrically and mechanically couple the package 2 to the support 7. The lead frame structure 21 may for example be configured to couple the package 2 to the support 7 with the package footprint side 202 facing to the support 7, for example such that the package footprint side 202 faces to the surface 70 of the support 7, as illustrated in FIGS. 1 and 2.

The lead frame structure 21 may serve as an electrically conductive interface between the load terminals of the die (and, if present, the one or more further terminals of the die) and other components (not illustrated) that are fixed at the support 7. For example, the support 7 may comprise or be provided with other components (not illustrated; for example, one or more other packages including one or more other dies, and/or a controller, a sensor, a passive component, a load or the like) to which the terminals of the die are to be coupled via the lead frame structure 21. A connection between the lead frame structure 21 and the terminals of the die, e.g., the load terminals, may be realized by package internal connection means (not illustrated). For connecting the die with other components fixed to the support 7, the lead frame structure 21 may comprise one or more outside terminals, as will now be explained in more detail:

For example, the outside terminals of the lead frame structure 21 comprise at least one first outside terminal 211 extending out of the package footprint side 202 and/or out of one of the sidewalls 203 and electrically connected with the first load terminal of the die. Of course, there can be more than one of such first outside terminal 211 that are each connected to the first load terminal of the die. Further, the outside terminals of the lead frame structure 21 may comprise at least one second outside terminal 212 extending out of the package footprint side 202 and/or out of one of the sidewalls 203 (for example out of a sidewall 203 arranged opposite to the sidewall 203 out of which the first outside terminal(s) 211 may extend, cf. FIG. 2) and electrically connected with the second load terminal of the die. Of course, there can be more than one of such second outside terminal 212 that are each connected to the second load terminal of the die. Further, the outside terminals of the lead frame structure 21 may comprise at least one third outside terminal (not illustrated) and/or at least one fourth outside terminal (not illustrated) extending out of the package footprint side 202 and/or out of one of the sidewalls 203 and electrically connected with a control terminal of the die (e.g., a gate terminal) and a sensor terminal (e.g., a current sensor terminal) of the die. Of course, there can be more than one of such third/forth outside terminal.

Each of the outside terminals 211, 212 of the lead frame 21 may be configured to be electrically and mechanically coupled to the support 7, e.g., by soldering.

Within the present specification, the term "outside" may express that the first outside terminal 211 and the second outside terminal 212 may be configured to be electrically contacted by means of components external of the package body 20.

In an embodiment, the outside terminals 211, 212 are planar outside terminals. For example, within the present specification, the term "planar" may express that the first terminal 211 and the second terminal 212 may exhibit a respective substantially plane bottom surface that has a size with horizontal dimensions (e.g. along each of the first lateral direction X and the second lateral direction Y) at least as great as a vertical dimension of the respective terminal 211, 212 (e.g. along the vertical direction Z), as exemplarily illustrated in FIG. 1. For example, the lead frame 21 has a surface-mount configuration. To this end, the outside terminals 211 and 212 may be configured to allow mounting the package 2 in accordance with the surface-mount technology. Further, each of the first outside terminal 211 and the second outside terminal 212 may be so-called flat contacts (also known as "terminal pads") formed in accordance with the surface-mount technology. Thus, the package 2 may be a leadless package, e.g., an SMD leadless package. In another embodiment, the outside terminals 211 and 212 are configured as contact pins or as contact balls.

The outside terminals 211 and 212 may be arranged separately and electrically insulated from each other.

For example, on the support 7, a first contact area of the first outside terminal 211 may be electrically connected with one or more first conductive traces (not illustrated), e.g., copper lines, of the support 7, and a second contact area of the second outside terminal 212 may be electrically connected with one or more second conductive traces (not illustrated), e.g., copper lines, of the support 7.

Accordingly, the load current conducted by the power semiconductor die between the first load terminal and the second load terminal can "leave" or, respectively "enter" the package 2 by means of the first outside terminal(s) 211 and "enter" or, respectively "leave" the package 2 by means of the second outside terminal(s) 212.

The package 2 may further comprise top layer 22 arranged at the package top side 201 and being electrically connected with the second load terminal of the die, e.g., also with the second outside terminal(s) 212. The top layer 22 may be made of an electrically conductive material. The top layer 22 may hence exhibit the same electrical potential as the second load terminal of the die, e.g., the high potential (e.g., the drain potential). Further, the top layer 22 may be electrically insulated from the first outside terminal(s) 211.

The top layer 22 can have a horizontal surface area amounting to at least 50%, to at least 60% or to even more than 80% of the total horizontal surface area of the package top side 201. This surface area may be exposed to the environment of the package body 20, i.e., the surface area of the top layer 22 is not enclosed within the package body 20, but forms a part of an exterior wall.

The package 2 is, for example, a top side cooling package with the top layer 22 being configured as a top side cooling. For example, at least most of the heat to be dissipated leaves the package body 20 via the top layer 22.

The top layer 22 can hence be configured to be coupled to a heat dissipation device 3, which can be, e.g., a heat spreader or a heat sink. For example, in case of a heat spreader, the top layer 22 can be configured to be electrically connected to the heat dissipation device 3. Thus, the heat spreader, which may be made of, e.g., copper, may exhibit the same electrical potential as the top layer 22, i.e., the second load terminal of the enclosed die. In another embodiment, the heat dissipation device 3 is a heat sink. In this case, the top layer 22 is coupled to the heat dissipation device, but electrically insulated therefrom. For example, between the top layer 22 and the heat sink, there may then be installed an isolating layer (not illustrated).

The following examples rather relate to the situation where the top layer 22 is electrically connected to a heat dissipation device 3 in the form of a heat spreader; i.e., to the situation where the heat dissipation device 3 exhibits the same electrical potential as the top layer 22, i.e., the second load terminal of the die.

The package top side 201 can comprise a first section 2011 at a first vertical level Z1 (cf. FIG. 2) and a second section 2012. For example, the top layer 22 is arranged substantially coplanar with the first section 2011 of the package top side 201; e.g., the top layer 22 does not protrude from the first section 2011 of the package top side 201. The first section 2011 may be the highest (as seen from the support 7) section of the package body 20.

When mounted, a bottom surface 32 of the heat dissipation device 3 can be arranged substantially coplanar with the top layer 22. Further, the bottom surface 32 of the heat dissipation device 3 may exhibit a horizontal bottom surface area greater than the horizontal surface area of the top layer 22. The bottom surface 32 of the heat dissipation device 3 may exhibit a horizontal bottom surface area about as large as the footprint area of the package 2. For example, when mounted, the heat dissipation device 3 can overlap horizontally with the second section 2012 of the package top side 201. Further, as the top layer 22 may be arranged substantially coplanar with the package top side 201, the heat dissipation device 3 may, when mounted to the top layer 22, also be arranged substantially coplanar with the package top side 201, and even be arranged in contact with the package top side 201.

In a simple form, the heat dissipation device 3 may be a copper (or aluminum or steel or the like) cuboid that is arranged in electrical and direct mechanical contact with the top layer 22; e.g., the cuboid may be soldered to the top layer 22.

For example, a creepage length between the electrical potential of the at least one first outside terminal 211 and the electrical potential of the top layer 22 is defined by a package body surface contour, wherein the surface contour is formed at least by the package top side 201 and the package sidewall 203. An exemplary course of the creepage length is illustrated in FIG. 1 by means of the dashed path 5. Accordingly, the course may start at the first outside terminal 211 and extend along the package side wall 203 to the package top side 201 and from there to an edge of the top layer 22. However, if the heat spreader 3 is mounted to the top layer 22, the course of the creepage length may terminate earlier, cf. e.g. FIG. 4B, according to which the heat spreader 3 is arranged substantially coplanar with the package top side 201 and extends to an edge 204 formed between the package top side 201 and the package sidewall 203; in such case, the course of the creepage length would end (respectively: start) at the edge 204.

In accordance with an embodiment, the package 2 comprises at least one structural feature 23 that also forms the surface contour and that is configured to increase the creepage length. The at least one structural feature 23 can be arranged at the package top side 201 and/or at the package side wall 203 (out of which the at least one first outside terminal 211 may extend).

The at least one structural feature 23 can, for example, include at least one of a step 231 (cf. FIGS. 1-4A and FIG. 4C) and a recess 232 (cf. FIG. 4B), wherein such kind of structural features may be implemented, e.g., within a process of forming the package body 20, which may be made of a molding mass. Thus, the step 231 may be a mold-step and the recess 232 may be a mold-recess, e.g., a step/recess implemented in or by means of the molding mass of the package body 20.

For example, as illustrated in FIG. 1, the step 231 can be implemented along the total dimension of the package top side 201 in the second lateral direction Y.

Figure 3:
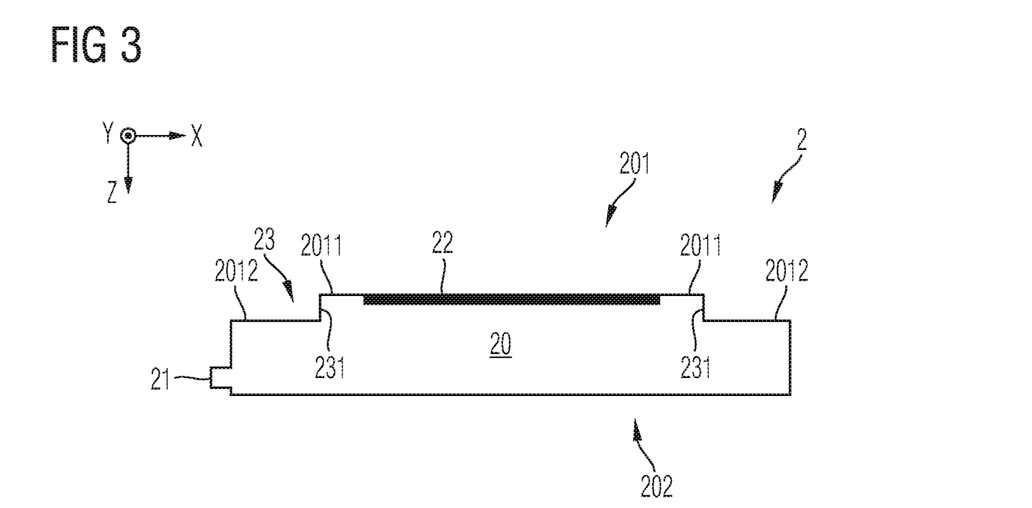
Figure 4A:
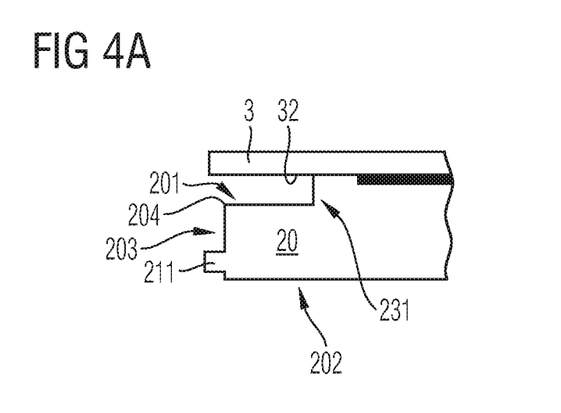
Figure 4B:
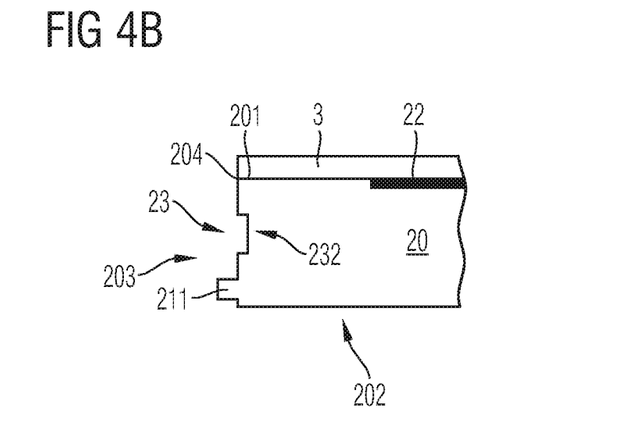
Figure 4C:
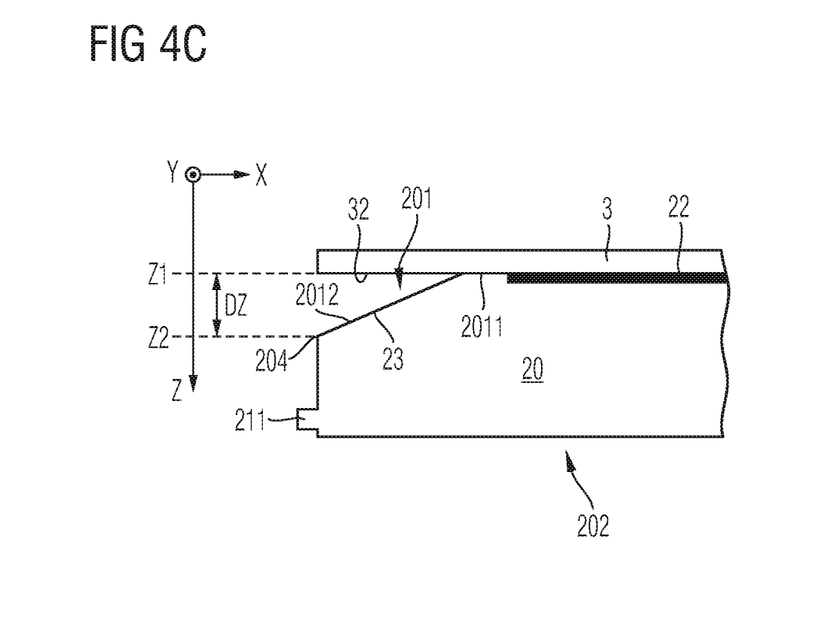

Also, a combination of a step 231 and a recess 232 is possible. For example, referring to FIG. 1, at the second section 2012 of the package top side 201 that is traversed by the course of the creepage length (cf. path 5), there could also be included one or more recesses to even further increase the creepage length. It is also possible to only provide a step 231 (e.g., as illustrated in FIGS. 1, 2, 3 and 4A and 4C) or only a recess, e.g., as illustrated in FIG. 4B.

According to the above explained exemplary arrangement of the heat dissipation device 3, if implemented as a single step 231, it is advisable to position such structural feature 23 at the package top side 201, and, if implemented as a single recess 232, it is advisable to position such structural feature 23 at the package sidewall 203, so as to effectively increase the creepage length.

Further, there are many possible ways of geometrically designing the structural feature 23. For example, instead of a vertical step, also an angular section could be provided (cf. FIG. 4C). Instead of a recess with a rectangular cross-section, also a well like recess with a half-circular or half-oval cross-section could be provided. In addition to or in alternative to the recess, there could also be provided a protruding section (not illustrated) at the package sidewall 203 so as to increase the creepage distance.

In an embodiment, the structural feature 23 is configured to increase the creepage distance by at least 5% compared to the situation in which no such structural feature is provided. The percentage increase could be even greater, e.g., greater than 10%, or greater than 20%, or even greater than 50%.

In an embodiment, the package top side 201 is separated into at least a first section 2011 at a first vertical level Z1 and at least a second section 2012 at or lower than a second vertical level Z2 that is lower than the first vertical level Z1. The top layer 22 can be arranged at the first section 2011 at the first vertical level Z1, and the second section 2012 can extend to the package sidewall 203 (out of which the at least one first outside terminal 211 may extend) and may form an edge 204 therewith.

In an embodiment, such separation of the package top side 201 may be achieved by means of the at least one structural feature 23 that increases the creepage length. Even though FIGS. 1-3 illustrate symmetrical divisions of the package top side 201, according to which the first section 2011 is neighbored by two second sections 2012 of equal areas, it shall be understood that the structural feature 23, e.g., the step 231, only needs to be present where the creepage length is to be increased. For example, if on the other package sidewall there are only present second outside terminals 212, there is no real need to increase the creepage length at this side since there, the difference between the electrical potential of the heat spreader 3 and the electrical potential of the second outside terminals 212 may be substantially zero.

The structural feature 23 may be positioned such when the heat dissipation device 3 (e.g., the heat spreader) is mounted to the top layer 22, it overlaps horizontally with the at least one structural feature 23, as exemplarily illustrated in FIGS. 2-4C.

In an embodiment, the package 2 comprises the heat dissipation device 3. The heat dissipation device 3 (e.g., the heat spreader) can be arranged external of the package body 20 and in electrical contact with the top layer 22, e.g., in direct mechanical contact with the top layer 22. For example, the heat spreader 3 is soldered to the top layer 22. In another embodiment, other coupling technologies may be employed, e.g., using an adhesive coupling or the like. In addition, a heat sink may be coupled to the heat spreader 3.

For example, with respect to the above mentioned horizontal overlap between the heat dissipation device 3 and the at least one structural feature 23, in a region where the heat dissipation device 3 passes over the top layer 22, the package top side 201 can be separated into the at least one first section 2011 at the first vertical level Z1 and the at least one second section 2012 at or lower than a second vertical level Z2 that is lower than the first vertical level Z1. Again, the top layer 22 can be arranged at the first section 2011 at the first vertical level Z1.

In an embodiment, the height difference DZ between the first vertical level Z1 and the second vertical level Z2 amounts to at least 0.1 mm. In an embodiment, the increase of the creepage length caused by the structural feature 23 amounts to a least this height difference DZ. The height difference DZ may be greater than 0.1 mm, e.g., greater than 1 mm or greater than 2 mm.

The second section 2012 may extend to the package sidewall 203 (e.g., the one out of which the at least one first load terminal 211 extends) and form the edge 204 therewith. For example, the second section 2012 extends for at least 1 mm towards the edge 204.

The embodiments described above include the recognition that the creepage length of an SMD-TSC package can be increased by structuring the relevant section of the package body between the outside terminal and the top layer, e.g., by providing a mold step at the package top side and/or at the package sidewall.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A package enclosing a power semiconductor die, the package having a package body with a package top side, a package footprint side and package sidewalls, the package sidewalls extending from the package footprint side to the package top side, wherein the die has a first load terminal and a second load terminal, wherein the package comprises:
   a lead frame structure comprising at least one first outside terminal extending out of the package footprint side and/or out of one of the sidewalls and electrically connected with the first load terminal of the die;
   a top layer arranged at the package top side and being electrically connected with the second load terminal of the die, wherein a creepage length between the electrical potential of the at least one first outside terminal and the electrical potential of the top layer is defined by a package body surface contour, the surface contour being formed at least by the package top side and the package sidewall; and
   at least one structural feature that also forms the surface contour and that increases the creepage length.

2. The package of claim 1, wherein the at least one structural feature is arranged at the package top side and/or at the package side wall.

3. The package of claim 1, wherein the at least one structural feature includes a step and/or a recess.

4. The package of claim 1, wherein the at least one structural feature separates the package top side into a first section at a first vertical level and a second section at or lower than a second vertical level that is lower than the first vertical level, the top layer being arranged at the first vertical level.

5. A package enclosing a power semiconductor die, the package having a package body with a package top side, a package footprint side and package sidewalls, the package sidewalls extending from the package footprint side to the package top side, wherein the die has a first load terminal and a second load terminal, wherein the package comprises:
   a lead frame structure comprising at least one first outside terminal extending out of the package footprint side and/or out of one of the sidewalls and electrically connected with the first load terminal of the die; and
   a top layer arranged at the package top side and being electrically connected with each of the second load terminal of the die,
   wherein:
   the package top side is separated into at least a first section at a first vertical level and at least a second section at or lower than a second vertical level that is lower than the first vertical level;
   the top layer is arranged at the first section at the first vertical level;
   the second section extends to the package sidewall and forms an edge therewith.

6. The package of claim 5, wherein the top layer is electrically and/or thermally conductive.

7. The package of claim 6, wherein the heat dissipation device has a horizontal bottom surface area greater than the horizontal surface area of the top layer.

8. The package of claim 5, wherein the heat dissipation device overlaps horizontally with the at least one structural feature.

9. A package enclosing a power semiconductor die, the package having a package body with a package top side, a package footprint side and package sidewalls, the package sidewalls extending from the package footprint side to the package top side, wherein the die has a first load terminal and a second load terminal, wherein the package comprises:
   a lead frame structure comprising at least one first outside terminal extending out of the package footprint side and/or out of one of the sidewalls and electrically connected with the first load terminal of the die;
   a top layer arranged at the package top side and being electrically connected with the second load terminal of the die; and
   a heat dissipation device arranged external of the package body and in electrical contact with the top layer, wherein the heat dissipation device has a bottom surface greater than the surface of the top layer, wherein in a region where the heat dissipation device passes over the top layer, wherein the package top side is separated into at least a first section at a first vertical level and at least a second section at or lower than a second vertical level that is lower than the first vertical level, wherein the top layer is arranged at the first section at the first vertical level.

10. The package of claim 9, wherein the bottom surface of the heat dissipation device is arranged substantially coplanar with the top layer.

11. The package of claim 9, wherein the top layer is arranged substantially coplanar with the first section.

12. The package of claim 9, wherein a height difference between the first vertical level and the second vertical level is at least 0.1 mm.

13. The package of claim 9, wherein the second section extends to the package sidewall and forms an edge therewith.

14. The package of claim 9, wherein the package is a top side cooling package with the top layer configured for top side cooling.

15. The package of claim 9, wherein the top layer has a horizontal surface area at least 50% of the total horizontal surface area of the package top side.

16. The package of claim 9, wherein a blocking voltage of the power semiconductor die is at least 50 V.

17. The package of claim 9, wherein the power semiconductor die includes a monolithic bidirectionally blocking and conducting power semiconductor switch.

18. The package of claim 9, wherein the package is an SMD package.

* * * * *

UNITED STATES PATENT AND TRADEMARK OFFICE
CERTIFICATE OF CORRECTION

PATENT NO. : 10,699,978 B2  
APPLICATION NO. : 16/124448  
DATED : June 30, 2020  
INVENTOR(S) : R. Otremba et al.

Page 1 of 1

It is certified that error appears in the above-identified patent and that said Letters Patent is hereby corrected as shown below:

On the Title Page

Column 2/abstract (Line 16), please change "contour is" to -- contour that is --.

Signed and Sealed this  
Twenty-fifth Day of August, 2020

Andrei Iancu  
*Director of the United States Patent and Trademark Office*